(12) United States Patent
Johnson (10) Patent No.: US 7,197,098 B2
(45) Date of Patent: Mar. 27, 2007

(54) HIGH-SPEED SERIAL DATA RECOVERY

(75) Inventor: Luke A. Johnson, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 1143 days.

(21) Appl. No.: 09/752,125

(22) Filed: Dec. 29, 2000

(65) Prior Publication Data

US 2002/0085655 A1   Jul. 4, 2002

(51) Int. Cl.
*H04L 25/40* (2006.01)
*H03M 13/00* (2006.01)

(52) U.S. Cl. ...................... 375/371; 714/752

(58) Field of Classification Search .............. 375/37 A, 375/316, 354, 329, 330, 371, 355; 714/752, 714/798, 758; 341/155, 118; 713/400, 600
See application file for complete search history.

(56) References Cited

U.S. PATENT DOCUMENTS 5,166,686 A * 11/1992 Sugiyama .................... 341/155
5,881,114 A * 3/1999 Moon .......................... 375/376
5,963,590 A * 10/1999 Nakaya et al. ............... 375/227
6,049,903 A * 4/2000 Nishimura ................... 714/752
6,177,893 B1 * 1/2001 Velazquez et al. .......... 341/118
6,487,672 B1 * 11/2002 Byrne et al. ................ 713/400
6,693,955 B1 * 2/2004 Arimitsu ..................... 375/150
6,850,580 B1 * 2/2005 Naoe .......................... 375/355

OTHER PUBLICATIONS

"Electronic Computer Glossary" 1981-1992—The Computer Language Company Inc.*
U.S. Appl. No. 09/475,497 Entitled *A Delay Locked Loop Based Circuit for Data Communication*; filed Dec. 30, 1999; pp. 1-24 and 10 Drawing Sheets.
U.S. Appl. No. 09/476,978 Entitled *Data Resynchronization Circuit*; filed Dec. 31, 2000; pp. 1-19 and 8 Drawing Sheets.

* cited by examiner

*Primary Examiner*—Khai Tran
(74) *Attorney, Agent, or Firm*—Trop, Pruner & Hu, P.C.

(57) ABSTRACT

A method and apparatus for high-speed serial data recovery. The apparatus comprises providing a storage device to store data and a block to adjust the position of the data in the storage device to account for at least one sampling error. The method comprises storing data into a storage device and adjusting the location of the data in the storage device to account for synchronization errors.

33 Claims, 5 Drawing Sheets

HIGH-SPEED SERIAL DATA RECOVERY

BACKGROUND

This invention relates generally to data communications, and, more particularly, to high-speed serial data recovery.

There is a trend in the industry to transition from typically lower-speed parallel interfaces to higher-speed serial interfaces in order to reduce system cost and improve performance. Serial interfaces commonly have a lower voltage requirement as well as a lower pin count. Additionally, serial interfaces typically use smaller, easier-to-route cables that result in reduced cable clutter.

High-speed serial interfaces generally employ clock recovery techniques to sample the incoming data. As such, high-speed serial interfaces are available to avoid the need for a separate wire for clock signaling. One technique becoming more prevalent in high-speed serial data recovery is oversampling, which may be used to extract data from an incoming serial bit stream.

Oversampling may result in lower cost, may be easier to integrate, and may have a faster lock time than other traditional analog techniques. Oversampling generally entails sampling data at a faster rate than the rate of the incoming data to extract the clock and data from the incoming data.

However, when oversampling, a mismatch between a receiver clock and a transmitter clock may result in either extra or fewer sampled bits at the output, depending on whether the receiver clock is faster or slower than the transmitter clock. That is, in one instance the frequency of the receiver clock may be slightly slower than the transmitter clock, while in another instance the receiver clock may be slightly faster. As a result of the frequency mismatches, in some cases one or more bits may be skipped or counted twice because the receiver clock may be faster or slower than the transmitter clock.

In some instances, elasticity registers have been used to account for the skipped or twice-counted sampled bits resulting from clock mismatches. However, such registers are generally of a finite size and, therefore, tend to have limited capacity to address the clock mismatch problem.

The use of spread spectrum clocking (SSC) in serial communications interfaces may exacerbate the above-mentioned clock mismatch problem during high-speed data recovery. SSC entails slightly varying the clock frequency at a relatively slow rate to spread any resulting emissions over a broad range of frequencies so that no one frequency in general violates applicable standards. In some instances, both the receiver clock and the transmitter clock may have varying frequencies. While the frequency variance may help to satisfy applicable standards, it may, in some cases, worsen the clock mismatch problem, thereby adversely affecting the serial data recovery process.

Thus, there is a need for an improved high-speed serial data recovery process.

BRIEF DESCRIPTION OF THE DRAWINGS

The invention may be understood by reference to the following description taken in conjunction with the accompanying drawings, in which like reference numerals identify like elements, and in which:

FIGS. 3A–5C illustrate sample contents of a storage device of the oversampling receiver of FIG. 2, in accordance with one embodiment of the present invention.

DETAILED DESCRIPTION

Figure 1:
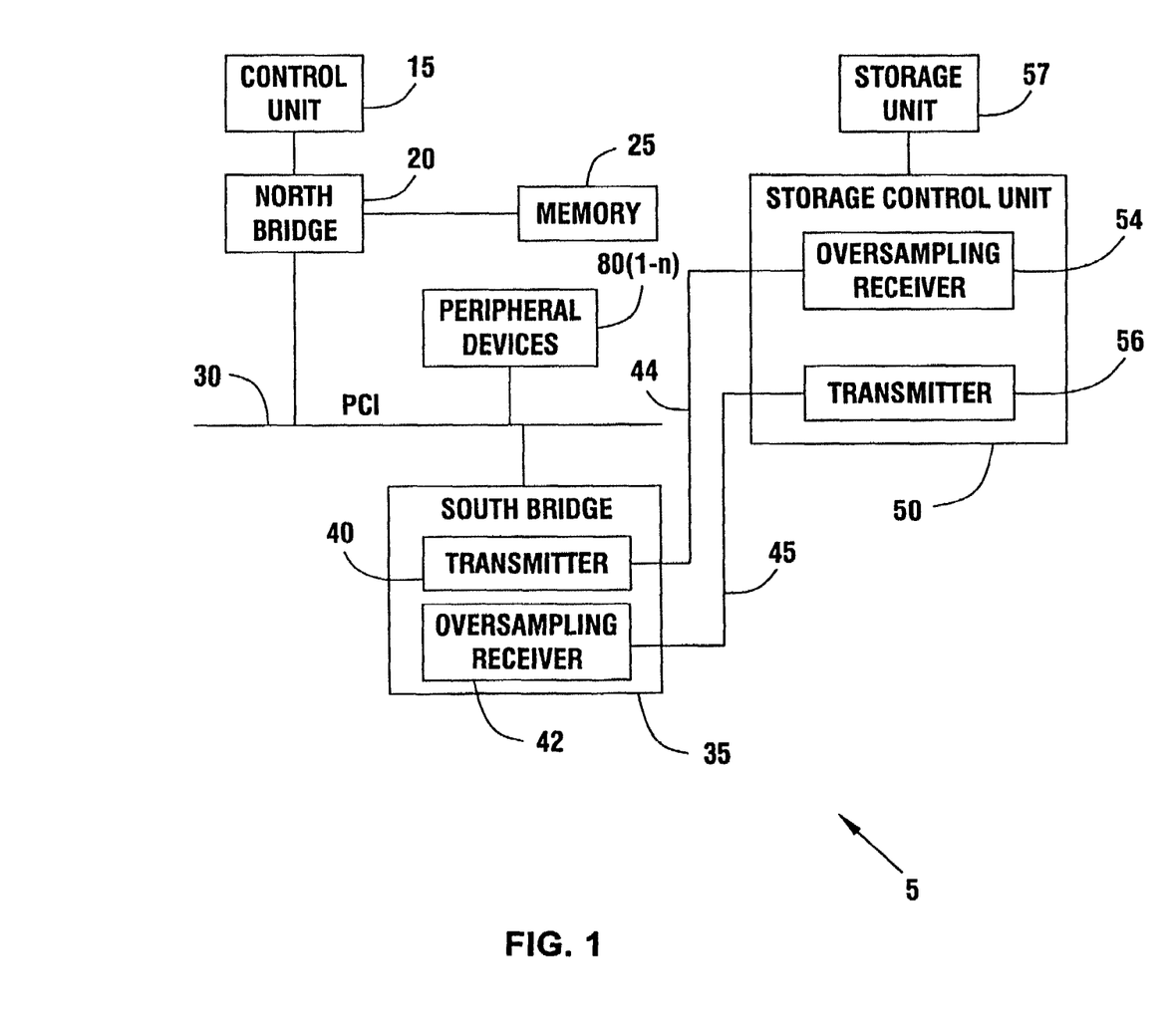
FIG. 1 is a stylized block diagram of a processor-based system employing an oversampling receiver in accordance with one embodiment of the present invention.

Referring now to FIG. 1, a stylized block diagram of a processor-based system 5 is shown in accordance with one embodiment of the present invention. The processor-based system 5 may be implemented in a laptop computer, desktop computer, main frame computer, television with a setup box, telephone, audio equipment, television, or any other device capable of receiving serial data communications.

The processor-based system 5 may comprise a control unit 15, which in one embodiment may be a processor. The control unit 15 in one embodiment may be capable of interfacing with a north bridge 20. The north bridge 20 may provide memory management functions for memory 25, as well as serve as a bridge to a peripheral component interconnect (PCI) bus 30. The processor-based system 5, in one embodiment, includes a south bridge 35 coupled to the PCI bus 30. The south bridge 35, in one embodiment, may include a transmitter 40 and an oversampling receiver 42.

In one embodiment, the transmitter 40 is capable of serially transmitting data over a communications link 44, and the oversampling receiver 42 is able to receive a serial stream of data over a communications link 45. Although the communications links 44 and 45 are illustrated as separate links, in an alternative embodiment, these links may be a single link.

A storage control unit 50 is coupled to the south bridge 35 by the communications links 44 and 45, in one embodiment. The storage control unit 50, in one embodiment, includes an oversampling receiver 54 for receiving information from the south bridge 35 over the communications link 44. In one embodiment the storage control unit 50 may include a transmitter 56 for transmitting information to the south bridge 35 over the communications link 45. The information received from the south bridge 35 may be stored by the storage control unit 50 in a storage unit 57.

In one embodiment, the storage control unit 50 and the storage unit 57 may comprise a single unit. Similarly, the receiver 54 and transmitter 56 may be a single transceiver unit in one embodiment.

In alternative embodiments, the transmitter 40 and the oversampling receiver 42 may be located in a variety of other elements as well, such as the control unit 15, north bridge 20, the peripheral devices 80(l-n) and the like, wherever serial communications may be useful or desirable.

For clarity and ease of illustration, only selected functional blocks of the processor-based system 5 are illustrated in FIG. 1, although those skilled in the art will appreciate that the processor-based system 5 may comprise additional functional blocks. Additionally, it should be appreciated that FIG. 1 illustrates one possible configuration of the processor-based system 5 and that other configurations comprising different interconnections may also be possible without deviating from the spirit and scope of one or more embodiments of the present invention.

Figure 2:
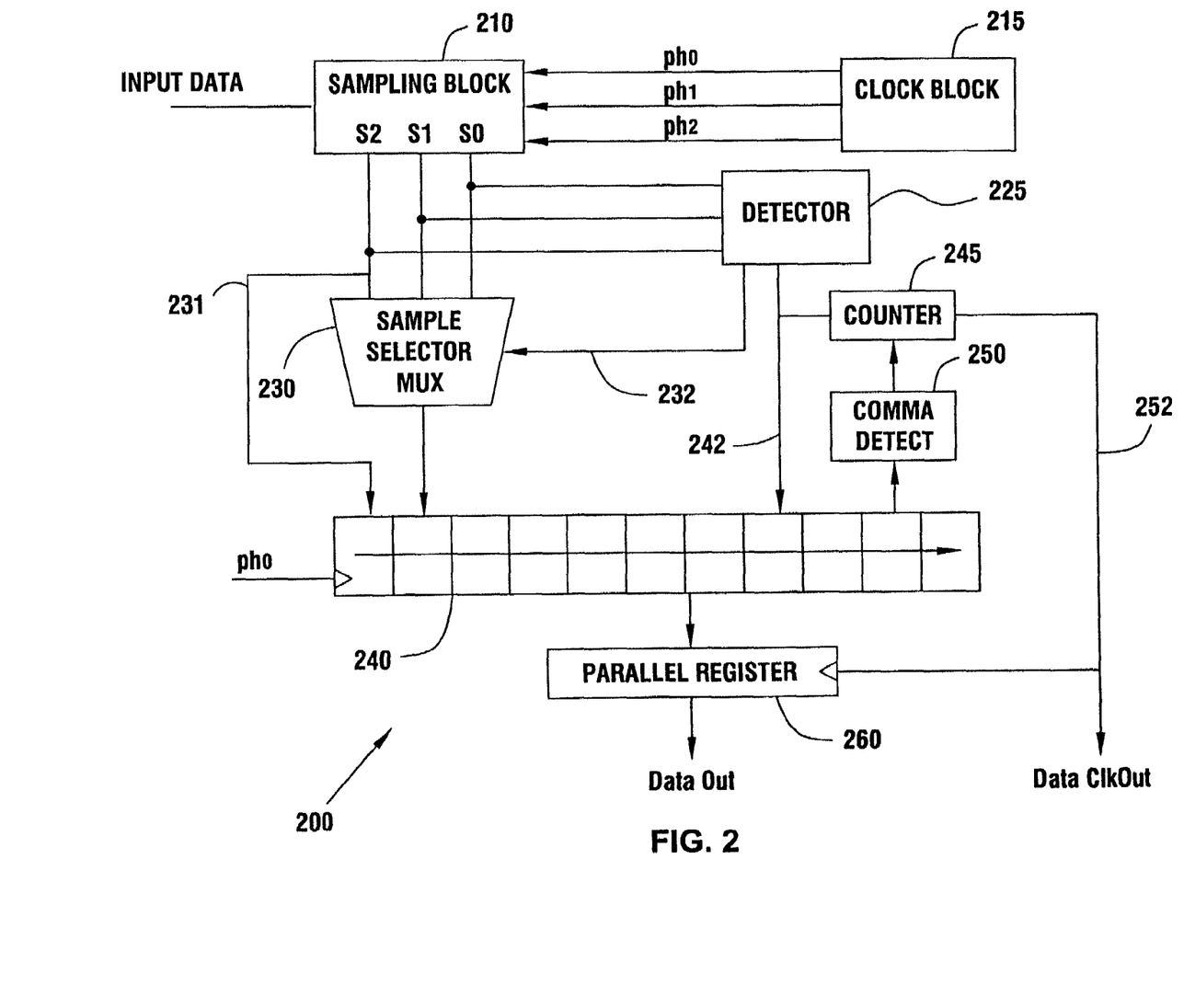
FIG. 2 is a block diagram of an oversampling receiver that may be implemented in the processor-based system of FIG. 1.

Referring now to FIG. 2, a block diagram of an oversampling receiver 200 in accordance with one embodiment of the present invention is illustrated. In one embodiment, the oversampling receiver 200 may be the oversampling receiver 42 of the south bridge 35 and/or the oversampling receiver 54 of the storage control unit 50 of the processor-based system 5 of FIG. 1.

The oversampling receiver 200 may include a sampling block 210, which, in one embodiment, receives an input data signal (also referred to as "incoming data"), which may be a serial stream of bits, for example. The serial stream of bits may be received at a first data rate, which, in one embodiment, may be one gigahertz.

The sampling block 210 may be adapted to receive a plurality of sampling clocks generated by a clock block 215. In one embodiment, the sampling block 210 samples the input data signal using the plurality of sampling clocks to obtain a plurality of samples. In one embodiment, the plurality of sampling clocks may be out of phase with each other. In one embodiment, six sampling clocks that are out of phase with each other may be used.

Although not so limited, in the illustrated example, the clock block 215 is a phase locked loop (PLL) that generates three sampling clocks, ph0, ph1, and ph2. In the illustrated embodiment, the sampling block 210 samples the input data signal at a rate that is substantially three times the data rate of the input data signal to generate three samples, s0, s1, and s2. Based on the three samples, for example, the oversampling receiver 200 may recover at least a portion of the incoming data.

The oversampling receiver 200 may oversample the incoming data in one of a variety of ways. As an example, the oversampling receiver 200 may use a sampling clock that is faster (e.g., 3 times, 4 times, 6 times, etc.) than the rate of the incoming data to sample the incoming data. As another example, a plurality of sampling clocks having substantially the same frequency as the input data signal may be phase-shifted to oversample the incoming data. As mentioned above, for example, the sampling block 210 uses, in one embodiment, three phase-shifted sampling clocks to sample each incoming bit three times to generate the s0, s1, and s2 samples.

The incoming data may also be oversampled in ways other than those mentioned herein. Regardless of the oversampling method employed, one or more embodiments of the instant invention may be employed to at least reduce the frequency mismatch problems that may occur when the frequency of the sampling clock does not match (or is not a multiple of) the rate of the incoming signal. Stated differently, a frequency mismatch may occur if the sampling rate of the oversampling receiver 200 is not the same as (or is not a multiple of) the rate of the incoming signal.

In some instances, one or more of the sampling clocks (e.g., ph0, phi, ph2) of the oversampling receiver 200 may not be perfectly synchronized with the rate of incoming data (e.g., clock of the transmitting device). That is, the frequency of the sampling clocks may not be exactly the same as the frequency of the transmitter clock (e.g., the clock of the transmitting device, such as the transmitter 40 of the south bridge 35). The term "transmitting device," as utilized herein, refers to a device from which the oversampling receiver 200 is receiving data.

In one embodiment, the oversampling receiver 200 includes a detector 225, which in the illustrated embodiment is an edge detector that may be capable of detecting transitions in the samples from the input data signal. The detector 225 may be a phase detector in one embodiment. Based on the location of the transitions within the plurality of samples, a desirable sample point, such as an optimal sample point, may be determined. In one embodiment, the desirable sample point represents a data bit of the input data signal.

The oversampling receiver 200 in one embodiment includes a sample selector multiplexer 230, which is capable of receiving the plurality of samples, as well as receiving a control signal from the detector 225 on a line 232. The sample selector multiplexer 230, based on the control signal from the detector 225, in one embodiment, selects a desirable point and provides it to a storage device 240 that is capable of shifting data by a preselected number of locations. In one embodiment, and as is described in more detail below, the storage device 40 may be a variable shift register that is capable of shifting data by zero, one, or two locations. The detector 225 provides an indication to the storage device 240 on line 242 to shift the data by a selected amount, in one embodiment.

In one embodiment, the s2 sample is provided to the storage device 240 over a line (i.e., also referred to as "bypass") 231. As described in more detail below, the s2 sample, in one embodiment, is delivered to the storage device 240 around the sample selector multiplexer 230 during instances when the oversampling receiver 200 samples the incoming data at a slower rate then the rate of the incoming data.

The oversampling circuit 200 may include a counter block 245, which counts the number of times data is shifted the storage device 240. In one embodiment, the counter block 245 receives the shift signal from the detector 225 over the line 242. Upon detecting a preselected number shifts, the counter block 245, may assert a dataclkout signal on line 252, as described in greater detail below.

In one embodiment, the data from the storage device 240 is provided to a parallel register 260. After the preselected number of bits has been shifted, the data may be latched and sent out as a parallel word. In one embodiment, the preselected number of bits may be ten, for example. In an alternative embodiment, the parallel register 260 may not be needed, and, instead, the output from the storage device 240 may be provided in a serial manner.

In one embodiment, the oversampling receiver 200 may include a comma detect block 250, which may provide a reset signal to the counter block 245 in response to identifying a unique sequence or pattern of bits that may identify the start of data. Thus, in one embodiment, the comma detect block 250 may be capable of identifying the start of data based on the unique sequence of bits. In one embodiment, upon detecting the unique sequence of bits, the comma detect block 250 may provide a reset signal to reset the counter block 245, which may then start tracking the number of shifts that occur to determine when a complete word and/or data packet has been received.

The oversampling receiver 200, in one embodiment, may operate in at least three different conditions. First, the frequency of the sampling clocks may be in synch with the rate of the incoming data such that there is no frequency mismatch problem (i.e., the frequency of the sampling rate is the same (or a desired multiple of) the rate of the incoming data). Second, the sampling rate of the oversampling receiver 200 may be slower than the rate of the incoming signal, which may result in a phase difference (e.g., phase lead) between the plurality of sampling clocks and the incoming data signal. Third, the sampling rate of the oversampling receiver 200 may be faster than the rate of the incoming data, which may result in a phase difference (e.g., phase lag) between the plurality of sampling clocks and the incoming data signal. The operation of the oversampling receiver 200 under each of the three above-described conditions is described in more detail below.

FIGS. 3A–5C illustrate examples of the contents of the storage device 240 in situations where the frequency of the sampling rate is the same, slower, and faster frequency than that of the input data signal. For ease of illustration, the input data signal is designated as a string of alphabet letters, as opposed to a series of ones and zeros. In the illustrative examples provided in FIGS. 3A–5C, it is assumed that the sequence of letters "ABCDEFGHI . . . " is provided to the oversampling receiver 200, starting from left to right (i.e., starting from "A" then "B" and so forth). The reference arrows in the FIGS. 3A–3b, 4A–4B, and 5A–5B indicate the entry point of the wrap-around sample from the line 231, as well as the entry point of the sample provided by the sample selector multiplexer 230.

Figure 3A:
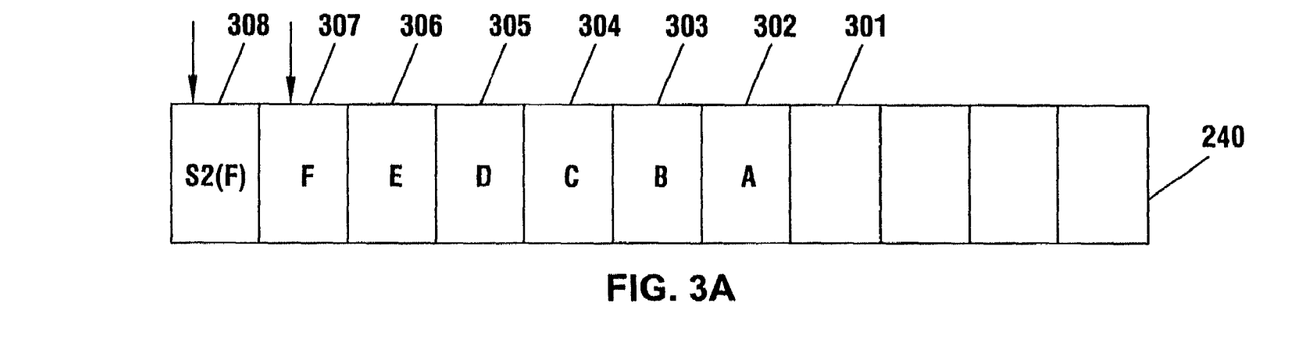
Figure 3B:
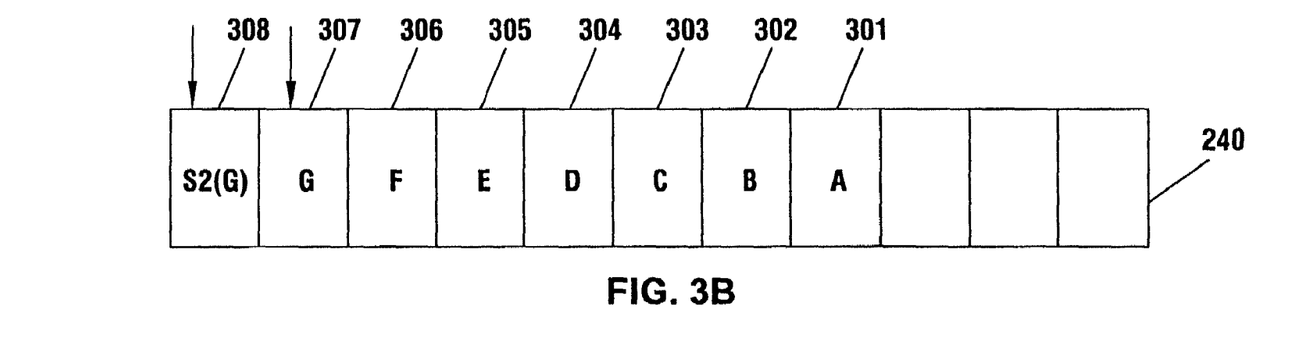
Figure 3C:
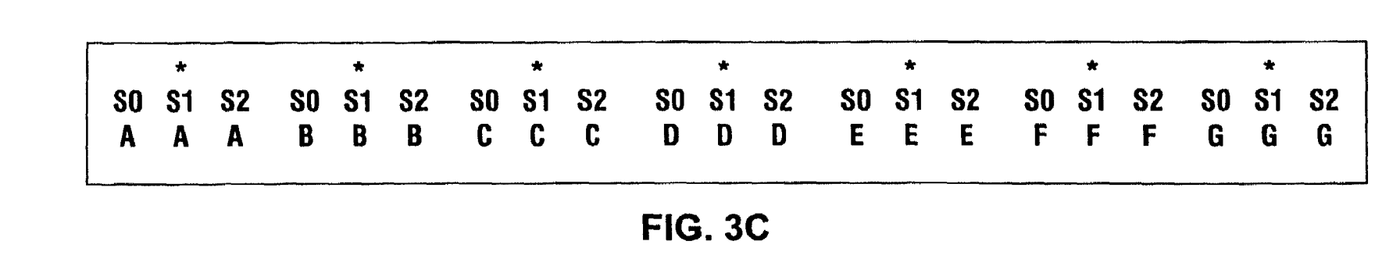

Referring in particular to FIGS. 3A, 3B, and 3C, an example of the contents of the storage device 240 is illustrated when one or more of the sampling clocks of the oversampling receiver 200 are operating in-phase (i.e., substantially synchronized) with the incoming data. When the frequency of the sampling clocks and the incoming data is substantially the same, as is described in more detail below, the contents of the storage device 240 are shifted to the right once, in one embodiment.

In the illustrated embodiment, data values A–F have been sampled from the incoming data signal and stored in locations 302–307, respectively, of the storage device 240. A first location 308 of the storage device 240 contains the S2 sample that is provided over the bypass 231, in one embodiment. In the illustrative example, the first location 308 contains the S2 sample that was sampled substantially simultaneously with the "F" data value, the value stored in the location 307. In accordance with one embodiment of the present invention, once the current samples ("F" and S2) are stored in the storage device 240, the location of the contents of the storage device 240 are shifted by one to the right, as shown in FIG. 3B. For example, data (i.e., "A") in location 302 is shifted to location 301, data (i.e., "B") in location 303 is moved to location 302, and so forth. Additionally, in one embodiment, substantially contemporaneously with the shifting of the contents of the storage device 240, the next sampled data (i.e., "G") is stored in the location 307, thereby overwriting the recently shifted S2 sampled value, as shown in FIG. 3B. The current (i.e., sampled substantially simultaneously with sample "G") S2 sample is stored in the first location 308, in one embodiment. The above described process of receiving and shifting data by one location continues until all of the data has been received, in one embodiment. Thus, when the receiver and transmitter clocks are substantially synchronized, in one embodiment, the data in the storage device 240 is shifted by one to the right for each sample received.

Referring to FIG. 3C, a sample selection is illustrated for a 3× oversampling embodiment. In this figure, each datapoint may be sampled three times. Looking at the first two groups of samples, the detector 225, in one embodiment, determines that the data transitioned from datum "A" to datum "B" between sample S2 and S0 and directs the sample selector multiplexer 230 to select sample S1 as denoted by the asterisk. This determination may be repeated for all data values.

Figure 4A:
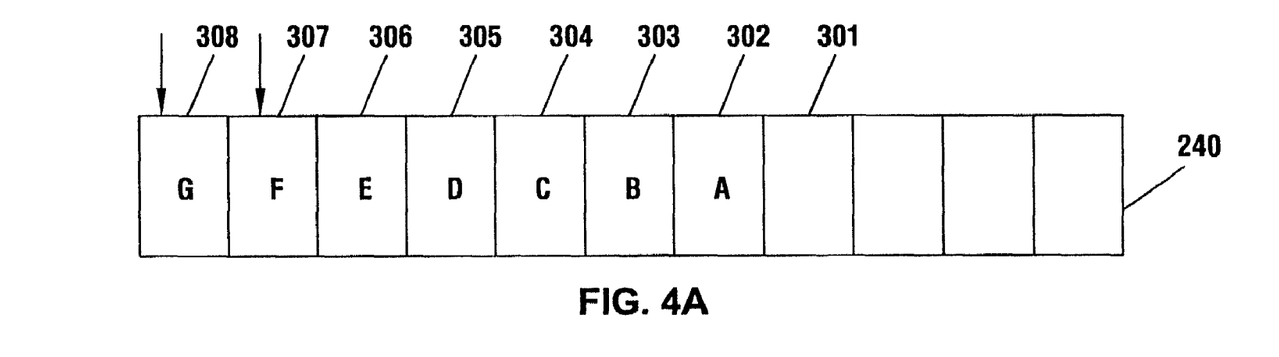
Figure 4B:
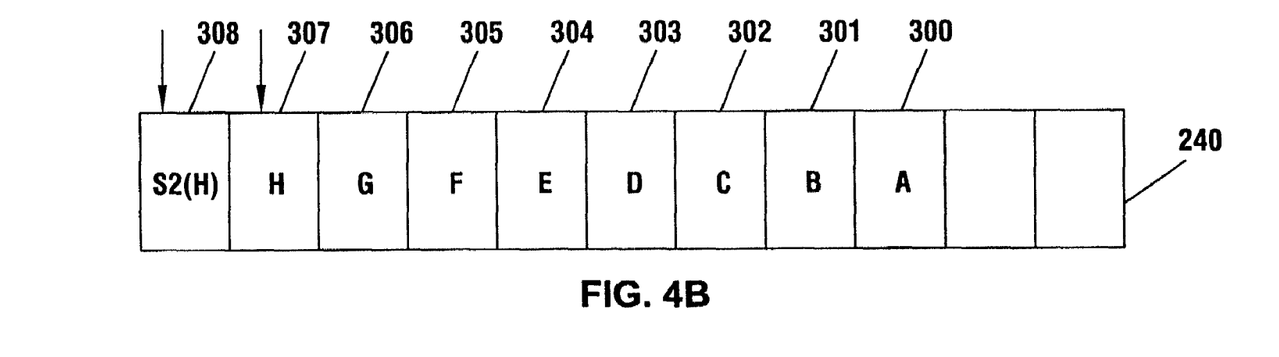
Figure 4C:
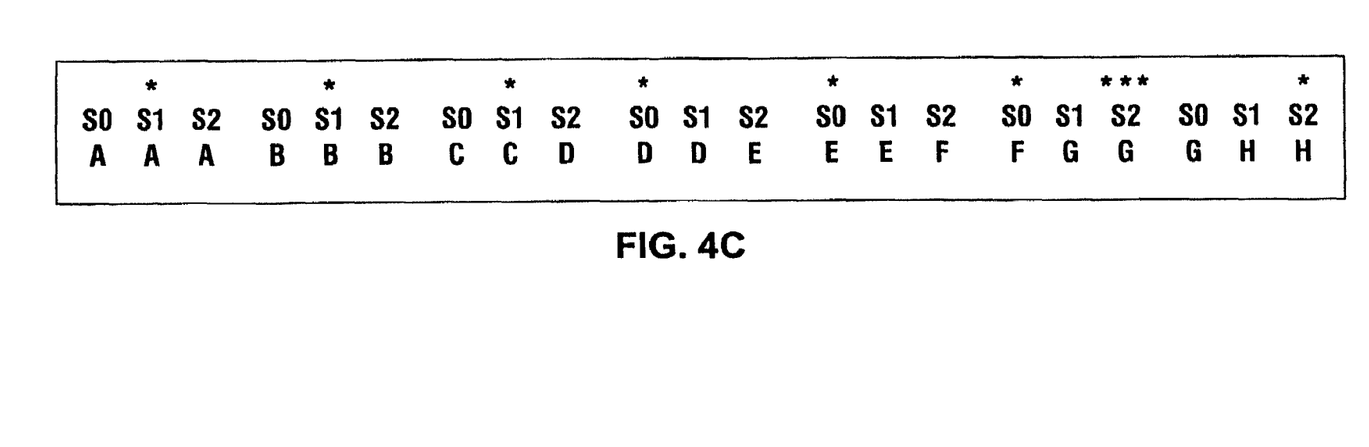

Referring to FIGS. 4A, 4B and 4C, an example of the contents of the storage device 240 is illustrated when the sampling rate of the oversampling receiver 200 is slower than the rate of the incoming data. Because the incoming data may be sampled at a rate slower than desired, occasionally the oversampling receiver 200 may get behind (lag) the input data signal. And, when a full bit of lag is detected by the detector 225, in one embodiment, two bits may be placed into the storage device 240. The detector 225, in one embodiment, may initiate this insertion of the extra bit when it determines that the sample selector multiplexer 230 was directed to select S0 (via select signal on the line 232) in the prior sample and now should select S2 in the current sample. The extra bit is provided over the bypass 231 around the sample selector multiplexer 230. The insertion of the extra data bit is exemplified in FIG. 4A.

As can been seen in FIG. 4A, the storage device 240 contains data "A–F" in respective locations 302–307. The S2 sample that was sampled substantially simultaneously with sample "F" is contained in location 308 (via the bypass 231) and is identical to the data value "G" in this scenario, in one embodiment. When it is desirable to insert an extra bit (i.e., when a sampling irregularity of error) is detected by the detector 225, in accordance with one embodiment of the present invention, the contents of the storage device 240 are shifted by two locations, as shown in FIG. 4B. The detector 225 provides the shift signal over the line 242 to the storage device 240, as well as to the counter block 245, in one embodiment. Additionally, in one embodiment, substantially contemporaneously with the shifting of the contents of the storage device 240, the next sampled data (i.e., "H") is stored in the location 307, while the current (i.e., sampled substantially simultaneously with sample "H") S2 sample is placed in the first location 308.

Referring to FIG. 4C, it can be seen that datum "G" may be lost if it was not shifted substantially simultaneously with datum "F." In FIG. 4C, "*" denotes the sample that is selected by the sample selector multiplexer 230 as directed by the detector 225, and "***" indicates a sample that would be missed if not shifted in with datum "F." The detector 225, in one embodiment, determines from the prior group of samples that the transition from datum "E" to datum "F" occurred between sample S1 and sample S2 and, therefore, directs the sample selector multiplexer 230 to select sample S0 of the current group, in one embodiment. The detector 225, in one embodiment, may determine from the current group that the transition from datum "F" to datum "G" occurred between sample S0 and sample S1, indicating that sample S2 of the current sample should be kept in addition to sample S0 as determined from the last group. To facilitate this capture of both S0 and S2 samples, the bypass 231 is implemented in one embodiment, and the storage device 240 is shifted two locations to prevent overwriting the bypass value. Thus, the oversampling receiver 200, in one embodiment, is able to account for the extra bit by shifting the contents of the storage device 240 by two locations, thereby keeping the sampled data substantially synchronized with the incoming data.

Figures 5A, 5B:
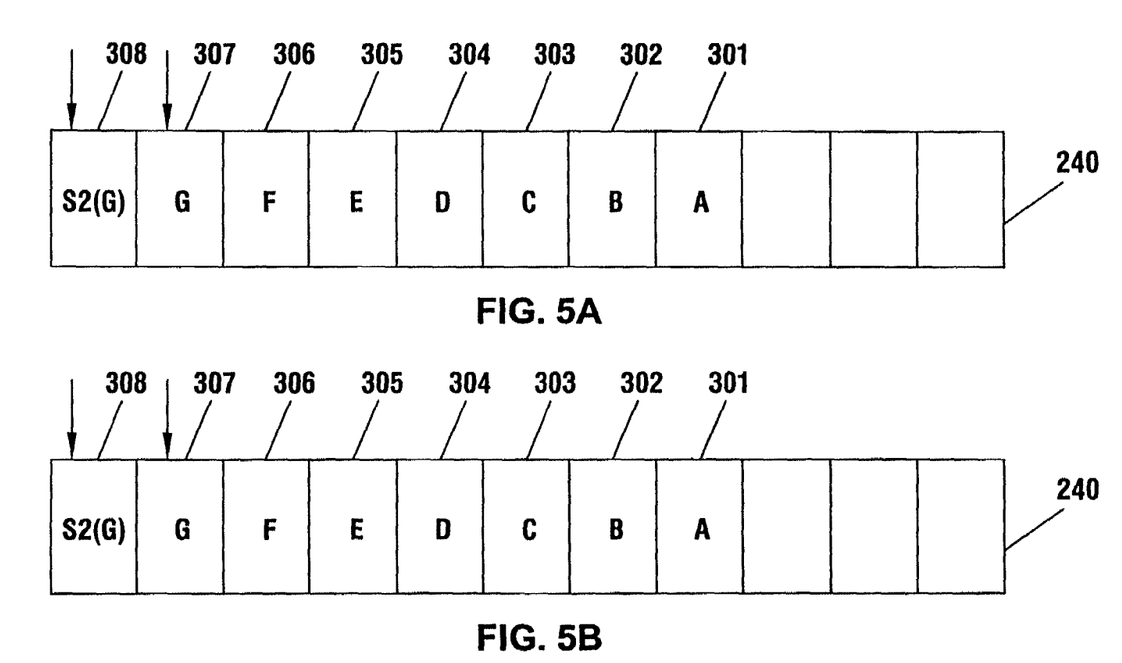
Figure 5C:
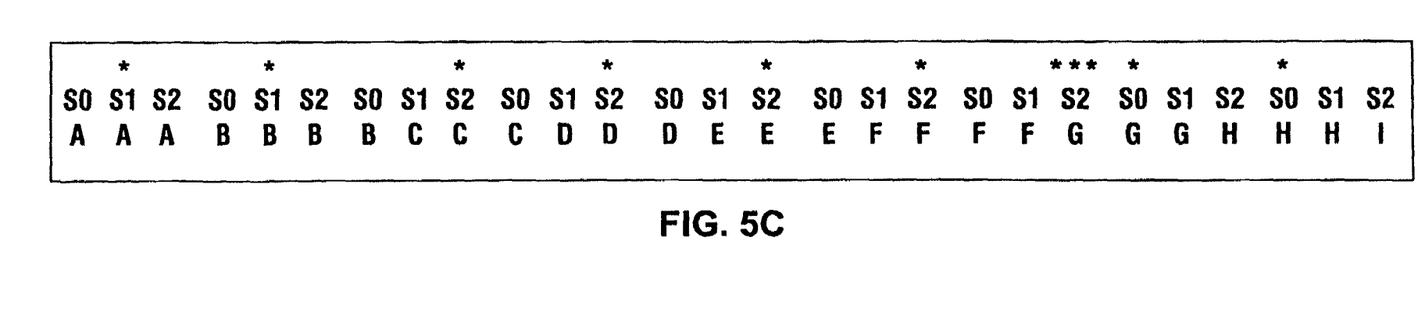

Referring in particular to FIGS. 5A, 5B, and 5C, an example of the contents of the storage device 240 is illustrated when the sampling rate of the oversampling receiver 200 may be faster than the rate of the incoming data. Because the incoming data may be sampled at a faster rate than desired, occasionally the oversampling receiver 200 may sample the same bit in the incoming data twice.

As can been seen in FIG. 5A, the storage device 240 has data "A–G" stored in respective locations 301–307. When the oversampling receiver 200 detects a duplicate sampled data (i.e., detects a sampling irregularity or error) the detector 225, in accordance with one embodiment of the present invention, indicates to the storage device 240 that no shift is desired.

As shown in FIG. 5B, in one embodiment, the next sampled data (i.e., "G" ) is stored in the location 307 and the current (i.e., sampled simultaneously with sample "G" S2 sample is stored in the first location 308 once the oversampling receiver 200 determines that no shift is desired. Thus, in one embodiment, the oversampling receiver 200 is able to account for the duplicative bit by not shifting the contents of the storage device 240, thereby allowing the next sampled data bit to replace the duplicate entry.

Referring to FIG. 5C, the detector 225, in one embodiment, may determine that a redundant bit has been inserted into the datastream when it determines that the sample selector multiplexer 230 was directed to select S2 (via select signal 232) in the prior sample and now should select S0 in the current sample. Specifically, in the example shown in FIG. 5C, the detector 225, determines that the transition from datum "F" to datum "G" occurred between sample S1 and sample S2 indicating that sample S0 of the following group should be selected, in one embodiment. However, in one embodiment, sample S2 is captured from the current group (as indicated by the transition of datum "E" to datum "F" in the prior group). Since the current S2 sample is the same (datum "G") as the next S0 sample, the detector 225, in one embodiment, directs the storage device 240 not to shift so that the redundant datum "G" is stored in the same call as the first datum "G". In FIG. 5C, "*" denotes the sample that is selected by the sample selector multiplexer 230 as directed by the detector 225, and "***" denotes redundant sample that should be removed from the datastream.

In addition to the variable shift storage device 240, the counter block 245 may also receive the shift signals on the line 242 to keep a running count of the number of bits shifted into the storage device 240 since it was last read, in one embodiment. In one embodiment, the counter block 245 may be implemented with a variable shift storage device similar or identical to storage device 240 but preloaded with a pattern to generate the DataClkout signal.

As described above, in one embodiment, the oversampling receiver 200 is capable of accounting for clock mismatches. The data in the storage device 240 of the oversampling receiver 200, in one embodiment, may not overrun because the dataclkout signal on the line 252 is substantially synchronized with the incoming data. In one embodiment, the oversampling receiver 200 may reduce the need to limit the packet size or the need for a reset mechanism, as may be sometimes required by conventional methods using elasticity buffers to accommodate the frequency difference.

With the advent of one or more embodiments of the present invention, it may be possible to defer to a higher-level layer above the oversampling receiver 200 in the processor-based system 5 to address at least a portion of the frequency skew issue, which may in part be caused because of spread spectrum clocking. For example, in the processor-based system 5, there may lie a first-in, first-out (FIFO) register between the oversampling receiver 200 and a link layer that may be able to absorb a part, if not all, of the frequency skew. In one embodiment, simplifying the oversampling receiver 200 in accordance with one or more embodiments of the present invention may make it possible to increase the overall performance of the oversampling receiver 200, as well as reduce its size.

The various system layers, routines, or modules may be executable control units (such as control unit 15 (see FIG. 2) in the processor-based system 5). Each control unit may include a microprocessor, a microcontroller, a processor card (including one or more microprocessors or controllers), or other control or computing devices.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An apparatus, comprising:
   a storage device to store data; and
   a block to adjust the position of the data in the storage device to account for a sampling rate of the apparatus being different than a rate of the received data, wherein the block comprises a sampling block to sample incoming data using a plurality of sampling clocks to provide a plurality of samples.

2. The apparatus of claim 1, wherein the block adjusts a portion of the data in response to receiving a plurality of bits in response to sampling a portion of an incoming data.

3. The apparatus of claim 1, wherein the block comprises a detector to detect the at least one sampling error.

4. The apparatus of claim 3, comprising a counter block to provide a clock substantially synchronous with the data in response to detecting the at least one sampling error.

5. The apparatus of claim 1, wherein the block comprises a multiplexer to receive the plurality of samples and provide a desirable sample to the storage device from the plurality of samples in response to a control signal.

6. The apparatus of claim 1, including a detector block to adjust the position of the data based on detecting at least one of a phase lag and a phase lead based on the plurality of samples.

7. The apparatus of claim 1, wherein the block does not shift the data in response to detecting duplicate sampling values of incoming data.

8. The apparatus of claim 1, wherein the storage device is a variable shift register.

9. An apparatus, comprising:
   a sampling block to sample incoming data using a plurality of sampling clocks to provide a plurality of samples;
   a detector block to detect when the frequency of a sampling clock is different from the rate of the incoming data; and
   a storage device to adjust the position of the data in response to detecting the difference in frequency of the sampling clock and the incoming data, wherein the storage device is a shift register.

10. The apparatus of claim 9, wherein the storage device is a variable shift register.

11. The apparatus of claim 10, further comprising a counter block to count a number of shifts of the variable shift register.

12. The apparatus of claim 11, further comprising a comma detect block to reset the counter block in response to detecting a unique sequence of bits.

13. The apparatus of claim 11, wherein the counter block is one of a variable shift register and an adder circuit.

14. The apparatus of claim 11, wherein the detector is one of a phase detector and an edge detector.

15. The apparatus of claim 9, wherein the sampling block samples the incoming data using three sampling clocks to provide three samples.

16. The apparatus of claim 9, further comprising a multiplexer to receive the plurality of samples and provide desirable sample from the plurality of samples to the storage device based on a control signal from the detector block.

17. An apparatus, comprising:
a clock block to generate a plurality of sampling clocks;
a sampling block to sample data using the plurality of sampling clocks to generate a plurality of sample values;
a detector block to detect that the frequency of a sampling clock is different from the frequency of the data being sampled; and
a shift register to receive at least one of the plurality of sample values and to shift the at least one of the plurality of sample values in response to the difference in frequency between the sample clock and the sampled data.

18. The apparatus of claim 17, wherein the detector is an edge detector.

19. The apparatus of claim 17, wherein the shift register is a variable shift register.

20. A method comprising:
storing data into a storage device;
adjusting the location of the data in the storage device to account for a difference in the frequency of the sampling rate versus the data rate of the data being received in the storage;
sampling incoming data to provide a plurality of samples;
detecting at least one sampling error in the plurality of samples; and
selecting a desirable sample from the plurality of samples and storing the desirable sample in the storage device.

21. The method of claim 20, wherein sampling the incoming data comprises sampling the incoming data at a rate at least three times faster than the rate of the incoming data.

22. The method of claim 20, wherein adjusting the location comprises shifting the data by two locations in the storage device to account for sampling frequency being slower than a rate of an incoming data.

23. The method of claim 20, wherein adjusting the location comprises not shifting the data in the storage device to account for sampling frequency being faster than a rate of an incoming data.

24. An apparatus, comprising:
a storage device to store data; and
a block to adjust the position of the data in the storage device to account for a sampling rate of the apparatus being different than a rate of the received data, wherein the storage device is a variable shift register.

25. The apparatus of claim 24, wherein the block comprises a detector to detect the at least one sampling error.

26. The apparatus of claim 25, comprising a counter block to provide a clock substantially synchronous with the data in response to detecting the at least one sampling error.

27. An apparatus, comprising:
a storage device to store data; and
a block to adjust the position of the data in the storage device to account for a sampling rate of the apparatus being different than a rate of the received data, wherein the block does not shift the data in response to detecting duplicate sampling values of incoming data.

28. The apparatus of claim 27, wherein the storage device is a variable shift register.

29. An apparatus, comprising:
a sampling block to sample incoming data using a plurality of sampling clocks to provide a plurality of samples;
a detector block to detect when the frequency of a sampling clock is different from the rate of the incoming data; and
a storage device to adjust the posilion of the data in response to detecting the difference in frequency of the sampling clock and the incoming data, wherein the sampling block samples the incoming data using three sampling clocks to provide three samples.

30. An apparatus, comprising:
a sampling block to sample incoming data using a plurality of sampling clocks to provide a plurality of samples;
a detector block to detect when the frequency of a sampling clock is different from the rate of the incoming data; and
a storage device to adjust the position of the data in response to detecting the difference in frequency of the sampling clock and the incoming data, further comprising a multiplexer to receive the plurality of samples and provide desirable sample from the plurality of samples to the storage device based on a control signal from the detector block.

31. A method comprising:
storing data in a storage device; and
adjusting the location of the data in the storage device to account for a difference in the frequency of the sampling rate versus the data rate of the data being received in the storage, wherein sampling the incoming data comprises sampling the incoming data at a rate at least three times faster than the rate of the incoming data.

32. A method comprising:
storing data in a storage device; and
adjusting the location of the data in the storage device to account for a difference in the frequency of the sampling rate versus the data i-ate of the data being received in the storage, wherein adjusting the location comprises not shifting the data in the storage device to account for sampling frequency being faster than a rate of an incoming data.

33. A method comprising:
storing data in a storage device; and
adjusting the location of the data in the storage device to account for a difference in the frequency of the sampling rate versus the data rate of the data being received in the storage, wherein adjusting the location comprises shifting the data by two locations in the storage device to account for sampling frequency being slower than a rate of an incoming data.

* * * * *

UNITED STATES PATENT AND TRADEMARK OFFICE
CERTIFICATE OF CORRECTION

PATENT NO. : 7,197,098 B2  Page 1 of 1
APPLICATION NO. : 09/752125
DATED : March 27, 2007
INVENTOR(S) : Luke A. Johnson It is certified that error appears in the above-identified patent and that said Letters Patent is hereby corrected as shown below:

Column 10:
Line 12, claim 29 "posilion" should be --position--;
Line 44, claim 32 "i-ate" should be --rate--.

Signed and Sealed this

Fourteenth Day of August, 2007

JON W. DUDAS
*Director of the United States Patent and Trademark Office*